(12) United States Patent
Berton

(10) Patent No.: US 11,862,955 B2
(45) Date of Patent: Jan. 2, 2024

(54) MARINE THRUSTER CONTROL POWER BOX ASSEMBLY

(71) Applicant: The Yacht Group, LLC, Coral Gables, FL (US)

(72) Inventor: Gerald Berton, Coral Gables, FL (US)

(73) Assignee: The Yacht Group, LLC, Coral Gables, FL (US)

( * ) Notice: Subject to any disclaimer, the term of this patent is extended or adjusted under 35 U.S.C. 154(b) by 0 days.

(21) Appl. No.: 18/131,261

(22) Filed: Apr. 5, 2023

(65) Prior Publication Data

US 2023/0318275 A1    Oct. 5, 2023

Related U.S. Application Data

(60) Provisional application No. 63/328,027, filed on Apr. 6, 2022, provisional application No. 63/327,674, filed on Apr. 5, 2022.

(51) Int. Cl.
| | |
|---|---|
| *H02G 3/18* | (2006.01) |
| *H05K 5/02* | (2006.01) |
| *H02G 3/22* | (2006.01) |
| *B63H 21/21* | (2006.01) |

(52) U.S. Cl.
CPC ............... *H02G 3/18* (2013.01); *B63H 21/21* (2013.01); *H02G 3/22* (2013.01); *H05K 5/0217* (2013.01); *H05K 5/0247* (2013.01); *B63H 2021/216* (2013.01)

(58) Field of Classification Search
CPC . H02G 3/18; H02G 3/22; B63H 21/21; B63H 2021/216; H05K 5/0217; H05K 5/0247
See application file for complete search history.

(56) References Cited

U.S. PATENT DOCUMENTS

| | | | | |
|---|---|---|---|---|
| 4,310,320 A | * | 1/1982 | Pitchford | B63H 5/08 440/61 R |
| 5,637,022 A | * | 6/1997 | Koike | B63H 21/213 440/87 |
| 6,113,442 A | * | 9/2000 | Nakamura | F01M 1/20 440/87 |
| 6,273,771 B1 | * | 8/2001 | Buckley | B63H 21/213 114/144 RE |

(Continued)

FOREIGN PATENT DOCUMENTS

WO    WO-2021216927 A1 * 10/2021 ............. B63B 1/242

*Primary Examiner* — S. Joseph Morano
*Assistant Examiner* — Jovon E Hayes
(74) *Attorney, Agent, or Firm* — The Concept Law Group, PA; Scott D. Smiley; Scott M. Garrett

(57) ABSTRACT

A thruster power control box assembly includes a housing having a cover. Inside the housing is a switch circuit and a switch control circuit. The switch circuit directs current from an external battery to a pair of thruster cables that are connected to a thruster. The switch control circuit controls the switch circuit by configuring the direction in which current from the battery flows to the thruster cables so that the thruster can operate in both directions. The housing incudes bushings through which the various cables and conductors pass, and are sealed by a compliant plug and a compression nut on each bushing. A terminal box can be used to connect the various cables of the thruster to their corresponding cables of the thruster power control box.

12 Claims, 14 Drawing Sheets

(56) References Cited

U.S. PATENT DOCUMENTS

| | | | | |
|---|---|---|---|---|
| 6,695,657 | B2* | 2/2004 | Hattori | B63B 34/10 |
| | | | | 123/319 |
| 2004/0090195 | A1* | 5/2004 | Motsenbocker | B60L 58/25 |
| | | | | 318/109 |
| 2017/0105313 | A1* | 4/2017 | Shedd | H05K 7/20809 |
| 2022/0119084 | A1* | 4/2022 | Miyagi | B63H 20/28 |

* cited by examiner

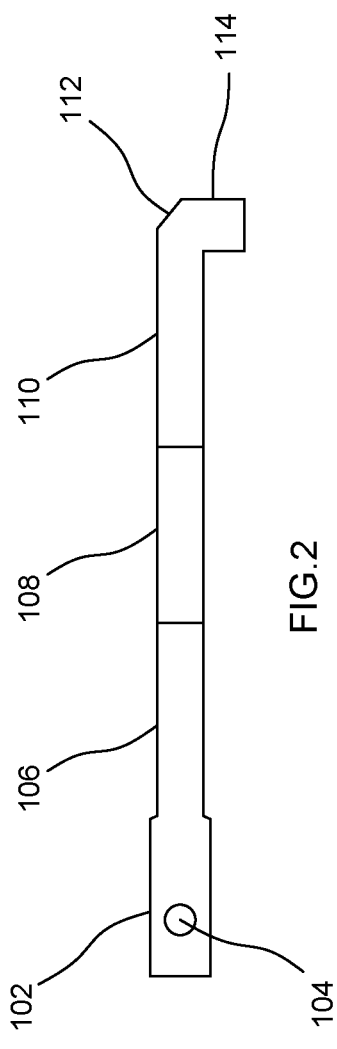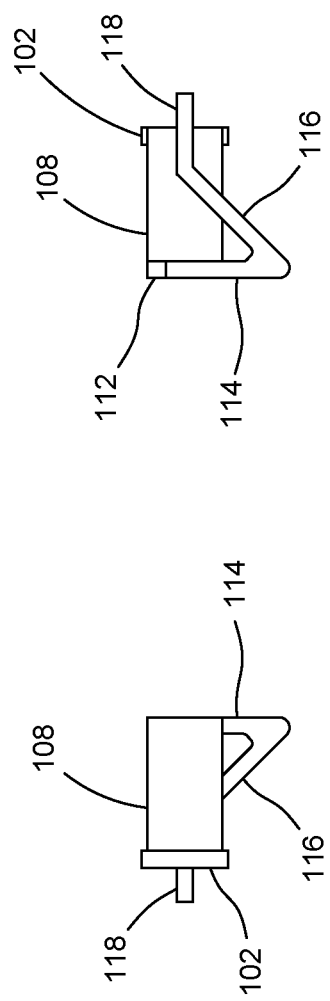
FIG.2
FIG.3
FIG.4

MARINE THRUSTER CONTROL POWER BOX ASSEMBLY

CROSS REFERENCE

This application claims priority to U.S. provisional application No. 63/327,674, filed Apr. 5, 2022, and further claims priority to U.S. provisional application No. 63/328,027, filed Apr. 6, 2022, the entireties of each of which are hereby incorporated by reference.

FIELD OF THE INVENTION

The present invention relates generally to marine thruster controls, and, more particularly, relates to a control power box in which power is controllably transferred from the vessel battery to a thruster, and which is configured to reduce or eliminate the need for installers to open the box to electrically connect the battery and thruster power leads.

BACKGROUND OF THE INVENTION

Thrusters have long been used in marine vessels for us in moving the bow of a boat sideway to assist with docking. In many applications once a boat is tied up at the bow, the main motor can be reversed and ruddered towards the dock to pull the stern toward the dock. In some vessels there is also an stern thruster in addition to a bow thruster. However there is a growing use of stern thrusters on relatively smaller boats, such as those used for water skiing and related recreation such as wakeboarding. Wakeboats, for example, are designed to create a wave behind the boat that a person can ride on a wakeboard in tow behind the boat. However, when the person being towed falls, it is desirable to turn the boat quickly. To do that, an stern thruster at the transom of the boat is used to push the stern to the side to allow the boat to be directed back to the person in the water.

A thruster uses a bidirectional impeller to thrust in either direction. Electric current is passed through the thruster motor in one direction to cause the impeller to turn in a first rotational direction, and the electric current can be directed in the opposite direction through the motor to make the impeller rotate in a second, opposite direction. The electric current is provided by a battery, which can be collection of battery cells or a battery bank. Electric current from the battery is connected to a thruster power box, which also is connected to a thruster control actuator which provides signals indicating the direction and speed the boat operator wants the thruster to turn. Inside the box is a power circuit that directs power from the battery to the thruster, and controls both the direction of current flow and the magnitude of current flow.

Conventionally, when installing a thruster power control box in a boat, the box is opened, and cables from the battery (e.g. positive and negative) are fed through openings in the side of the box and connected to corresponding terminals inside the box. Likewise, the cables to the thruster are passed through an opening in the box and connected to output terminals of the power electronics in the box. This presents a problem, which is that when the box is open, as the battery cables are being connected, there is a chance of an accidental shorting of the battery positive and negative together, which can create an ignition risk. Further, as such boxes are sealed with gaskets to prevent water or vapor intrusion, an inattentive installer can inadvertently misalign the gasket, resulting in a compromised seal. Such inadvertent shorting incidents have led to the ignition of fumes on vessels and have been responsible for vessel fires.

Therefore, a need exists to overcome the problems with the prior art as discussed above.

SUMMARY

In accordance with some embodiments of the inventive disclosure, there is provided a marine thruster power control box assembly that includes a housing having a lower housing portion and an upper housing portion. There is a power switch circuit and a switch control circuit disposed in the lower portion of the housing. There is also a first conductor bar extending through a front side of the lower portion of the housing that has a connector extension section outside of the lower housing portion, and a contiguous section inside the lower housing portion that is coupled to a first input of a switch circuit inside the housing. There is a second conductor bar extending through the front side of the lower portion of the housing that has a connector extension section outside of the lower housing portion, and a contiguous section inside the lower housing portion that is coupled to a second input of the switch circuit. There is also a first thruster cable coupled to a first output of the switch circuit and a second thruster cable coupled to a second output of the switch circuit. The first and second thruster cables pass through the side of the lower housing and extend outside of the lower housing. There is also included a thruster actuator control cable that passes through a side of the lower housing portion and connects to a switch circuit controller that controls operation of the switch circuit.

In accordance with a further feature, the first conductor bar passes through a first bushing, the second conductor bar passes through a second bushing, wherein each of the bushings include a compliant plug configured to seal the respective bushing, wherein the first and second conductor bars each pass through a channel in the respective plugs.

In accordance with a further feature, the first and second bushing each have distal fingers on a distal end of the respective bushing, and wherein each of the first and second bushings each include a compression nut that bears against the distal fingers to impart a compressive force to the plug in the bushing.

In accordance with a further feature, the thruster actuator control cable passes through a compliant plug disposed in a thruster cable bushing that passes through the side of the housing.

In accordance with a further feature, there is further provided a thruster cable bushing through the side of the housing, wherein the thruster cables both pass through a compliant plug disposed in the thruster cable bushing.

In accordance with a further feature, there is further provided a thermal sensing cable that passes through the plug in the thruster cable bushing.

In accordance with some embodiments of the inventive disclosure, there is provided a thruster power control box that includes a housing having a base and a cover. There is a switch circuit disposed in the housing that has a first input and a second input, and further has a first output and a second output. The switch circuit is operable to selectively connect, in a first switch state, the first input to the first output and the second input to the second output, and in a second switch state connect the first input to the second output and the second input to the first output. There is also a switch control circuit that is responsive to an actuator input to control the switch circuit between the first and second switch states. The box also includes a first battery conductor connected to the first input of the switch circuit at a terminal section of the first battery conductor. The first battery conductor has a battery end that extends through a first conductor bushing in a side of the housing. The first conductor bushing has a seal around the first battery conductor. There is also a second battery conductor connected to the second input of the switch circuit at a terminal section of the second battery conductor. The second battery conductor has a battery end that extends through a second conductor bushing in the side of the housing. The second conductor bushing has a seal around the second battery conductor. There is also a first thruster cable coupled to the first output of the switch circuit, and a second thruster cable coupled to the second output of the switch circuit. The first and second thruster cables pass through a thruster cable bushing through the side of the housing. The thruster cable bushing has a seal around the first and second thruster cables. There is also a thruster actuator cable that is coupled to the switch control circuit and which passes through a thruster actuator bushing through the side of the housing. The thruster actuator bushing has a seal around the thruster actuator cable.

In accordance with a further feature, the seal in the first conductor bushing includes a compliant plug through which the first battery conductor passes and which surrounds the first battery conductor. A compression nut is disposed on the first conductor bushing which compresses the compliant plug against the first battery conductor. The seal in the second conductor bushing includes a compliant plug through which the second battery conductor passes and which surrounds the second battery conductor. A compression nut disposed on the second conductor bushing compresses the compliant plug in the second bushing against the second battery conductor.

In accordance with a further feature, the seal in the thruster cable bushing comprises a compliant plug through which the first thruster cable and the second thruster cable both pass, and which surrounds both the first and second thruster cables, and wherein a compression nut disposed on the thruster cable bushing compresses the compliant plug in the thruster cable bushing against the first and second thruster cables.

In accordance with a further feature, the seal in the thruster actuator bushing comprises a compliant plug through which the thruster actuator cable passes, and which surrounds the thruster actuator cable, and wherein a compression nut disposed on the thruster actuator bushing compresses the compliant plug in the thruster actuator bushing against the thruster actuator cable.

In accordance with some embodiments of the inventive disclosure, there is provided a thruster power control box system includes a thruster power control box and an associated terminal box. The thruster power control box includes a housing and has a switch circuit disposed in the housing that has a first input, a second input, a first output, and a second output. There is also a switch control circuit that is operably coupled to the switch circuit. The switch control circuit selectively controls configuration of connections between the first input and one of either of the first or second outputs, and between the second input and the other of the first or second outputs of the switch circuit. That is, in a first switch state, the first input is exclusively connected to the first output, and the second input is exclusively connected to the second output. In a second switch state the first input is connected exclusively to the second output, and the second input is connected exclusively to the first output. There is also a first battery conductor that has a battery connecting portion that extends outside of the housing through a first conductor bushing that contains a compliant plug through which the first battery conductor passes and which seals the first conductor bushing. The first battery conductor is connected to the first input of the switch circuit. There is also a second battery conductor that has a battery connecting portion that extends outside of the housing through a second conductor bushing that contains a compliant plug through which the second battery conductor passes and which seals the second conductor bushing. The second battery conductor is connected to the second input of the switch circuit. There is also a thruster cable bushing having a compliant plug through which a first thruster cable and a second thruster cable pass. The first thruster cable is connected to the first output of the switch circuit, and the second thruster cable is connected to the second output of the switch circuit. There is also a thruster actuator bushing that has a compliant plug through which a thruster actuator cable passes. The thruster actuator cable is connected to the switch control circuit. The terminal box has a housing and a cover. There is a central wall inside the terminal box that runs from a front to a back of the terminal box, and from a floor of the housing to the cover. There is also a first terminal disposed on a first side of the central wall and a second terminal disposed on a second side of the central wall. The first thruster cable is coupled to the first terminal and the second thruster cable is coupled to the second terminal.

In accordance with a further feature, each of the first conduct bushing, second conductor bushing, thruster cable bushing, and thruster actuator bushing each comprise a compression nut that compressed the compliant plug in each of the first conduct bushing, second conductor bushing, thruster cable bushing, and thruster actuator bushing.

Although the invention is illustrated and described herein as embodied in a thruster power control box assembly, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

In the description of the embodiments of the present invention, unless otherwise specified, azimuth or positional relationships indicated by terms such as "up", "down", "left", "right", "inside", "outside", "front", "back", "head", "tail" and so on, are azimuth or positional relationships based on the drawings, which are only to facilitate description of the embodiments of the present invention and simplify the description, but not to indicate or imply that the devices or components must have a specific azimuth, or be constructed or operated in the specific azimuth, which thus cannot be understood as a limitation to the embodiments of the present invention. Furthermore, terms such as "first", "second", "third" and so on are only used for descriptive purposes, and cannot be construed as indicating or implying relative importance.

In the description of the embodiments of the present invention, it should be noted that, unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. To the extent that the inventive disclosure relies on or uses software or computer implemented embodiments, the terms "program," "software application," and the like as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system. Those skilled in the art can understand the specific meanings of the above-mentioned terms in the embodiments of the present invention according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

FIG. 2 is a side view of a battery current conductor for use in a thruster power control box assembly, in accordance with some embodiments;

FIG. 3 is a front view of a battery current conductor for use in a thruster power control box assembly, in accordance with some embodiments;

FIG. 4 is a rear view of a battery current conductor for use in a thruster power control box assembly, in accordance with some embodiments;

DETAILED DESCRIPTION

Figure 1:
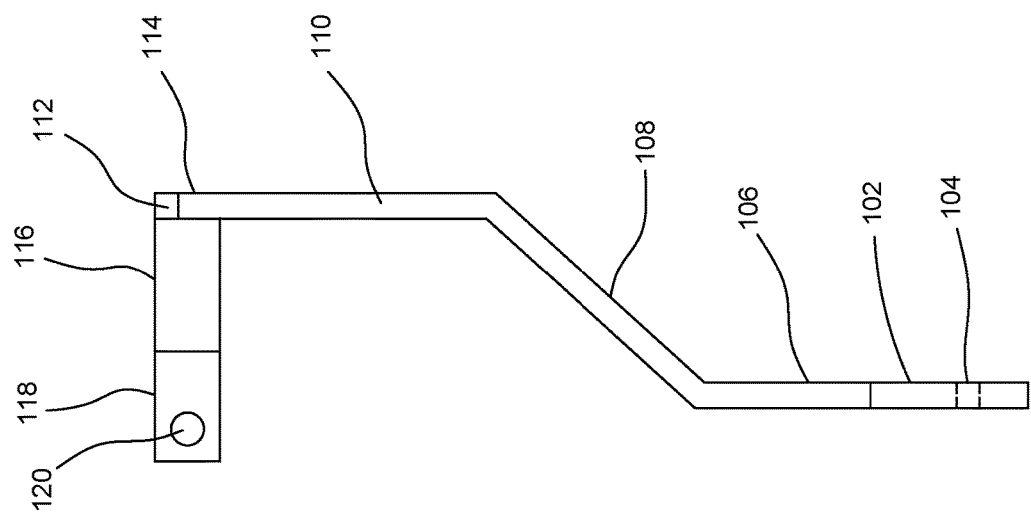
FIG. 1 is a top plan view of a battery current conductor for use in a thruster power control box assembly, in accordance with some embodiments.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

FIG. 1 is a top plan view of a battery current conductor 100 for use in a thruster power control box assembly, in accordance with some embodiments. The thruster power control box assembly will include two of these, which will be mirror images of each other along a vertical line to the left of the current conductor 100 shown here. The conductor 100 can be a plated copper bar that is configured to provide clearance inside the control box and to extend outside of the control box to obviate the need to open the control box. In the present example, the conductor bar 100 is deeper (i.e. into the page) than it is wide/thick. In FIG. 2, for example, it can be seen that the present exemplary conductor bar is taller than it is thick (e.g. from side to side in FIG. 1). FIGS. 2-4 show a side view, front view, and rear view of the conductor 100, respectively. The conductor includes a battery connection end 102 that extends out of the control box and includes an aperture 104 for connecting to a battery cable (e.g., to the vessel battery). A connection end 102 is contiguous with a pass-through section 106 which passes through a plug bushing that seals around the conductor bar and the box, as will be shown. The pass-through section 106 is contiguous with a first angled section 108 and is angled relative to a general direction elongated direction of the pass-through section 106 and connection end 102. The angle can be from forty five to ninety degrees in some embodiments, and more or less in other embodiments. The first angled section 108 routes the rest of the conductor bar 100 to the side of components in the thruster power control box, as will be shown herein. A side section 110 is contiguous with, and extends from the angled section 108, and generally travels in a direction parallel to that of elongated direction of the pass-through section 106 and connector end 102, but offset to the side so as to traverse along a side of the thruster power control box. At a distal end of the side section 110, the conductor bar turns downward, along a downward section 114, and a chamfered corner 112 is provided at the top of the conductor bar 100. The downward section 114 can be as thick, side to side, as the other parts of the conductor bar 100, and extends downward from the bottom of the distal end of the side section 110. The downward section 114 is contiguous with an upward angled section 116 that rises at about a forty five degree angle in some embodiments, but can be at other angles. The upward angled section changes the orientation of the conductor bar 100 from having the width of the conductor bar 100 being vertically oriented in sections 102, 106, 108, 110, to being horizontally oriented in the upward angled section 116 and the flat terminal section 118 at the end of the upward angled section. An aperture 120 allows the end of the conductor bar to connect to the switch control in the thruster power control box assembly. The conductor bar 100 can have a thickness of about four millimeters, and a width (height) of about twelve to twenty millimeters in some embodiments, but those dimensions can vary by +/−50% in other embodiments. In general, the battery connecting end 102 of the conductor bars are configured to extend out of the thruster power control box, while the portion of the conductor bars inside the thruster power control box are generally routed around the main interior portion of the thruster power control box and circuitry. Further, the conductor bars have appropriate dimensions to carry a maximum load of current to be supplied to the thruster without introducing significant resistance in the circuit, which would power to the thruster and generates heat inside the thruster power control box. In general, the conductor bars 100 are pre-formed conductors configured to handle relatively large amounts of electric current without introducing substantial electrical resistance. Be pre-formed avoids the tasks of having to form a cable, for example, with equivalent electrical properties so that the cable is routed to the side of the thruster power control box. The conductor bars 100 can be cut from sheet metal of an appropriate gauge, and then drilled and bent by machine to the desired form factor, which makes assembly of the thruster power control box simpler and more efficient. It also ensures that, if an entity does open the box to service it after it has been installed on a vessel, the rigidity of the conductor bars will keep them in position, whereas if a cable portion were used instead, the servicing person may inadvertently move a cable to a point where it may contact a hot component, which could compromise the insulation (if any) and create an electrical hazard.

Figure 5:
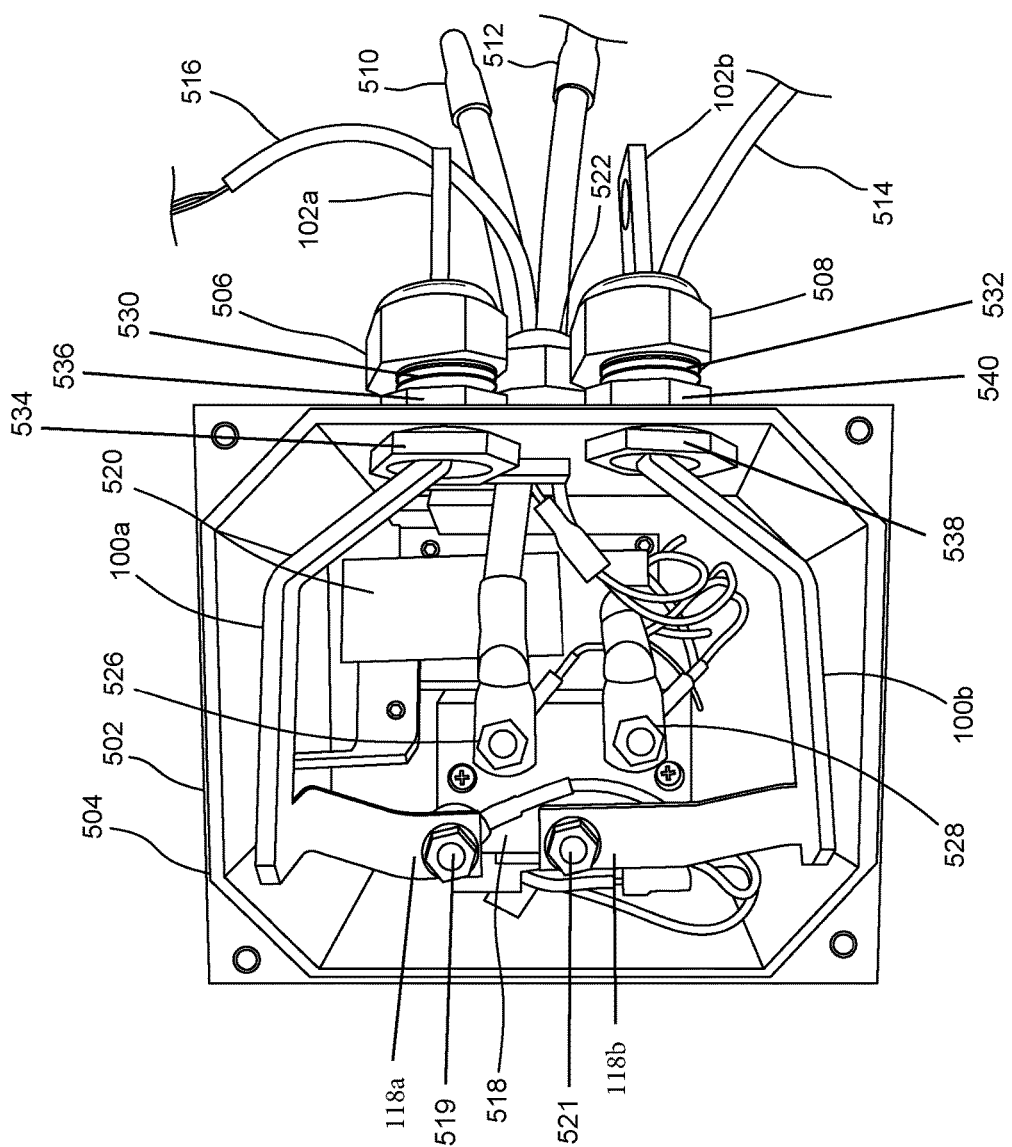
FIG. 5 is a top view of an open thruster power control box assembly, in accordance with some embodiments.
Figure 6:
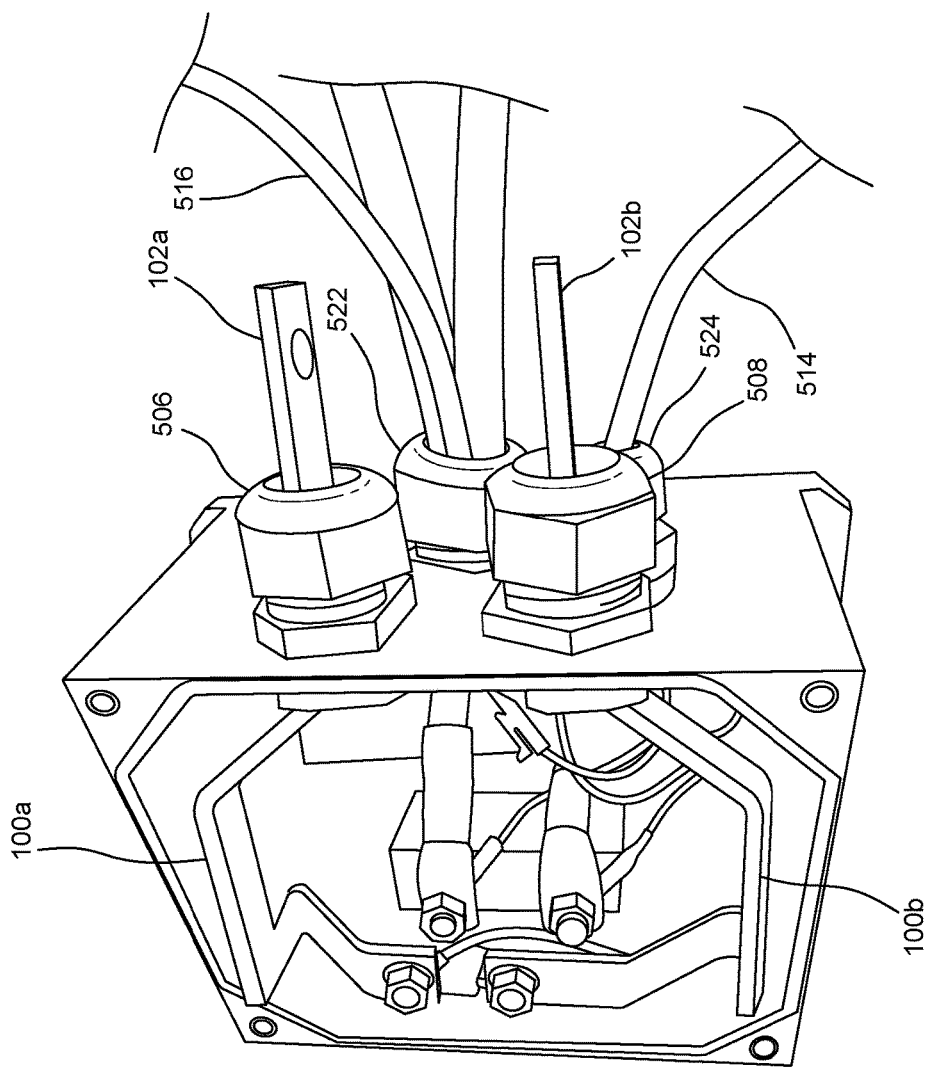
FIG. 6 is front top perspective view of an open thruster power control box assembly, in accordance with some embodiments.
Figure 7:
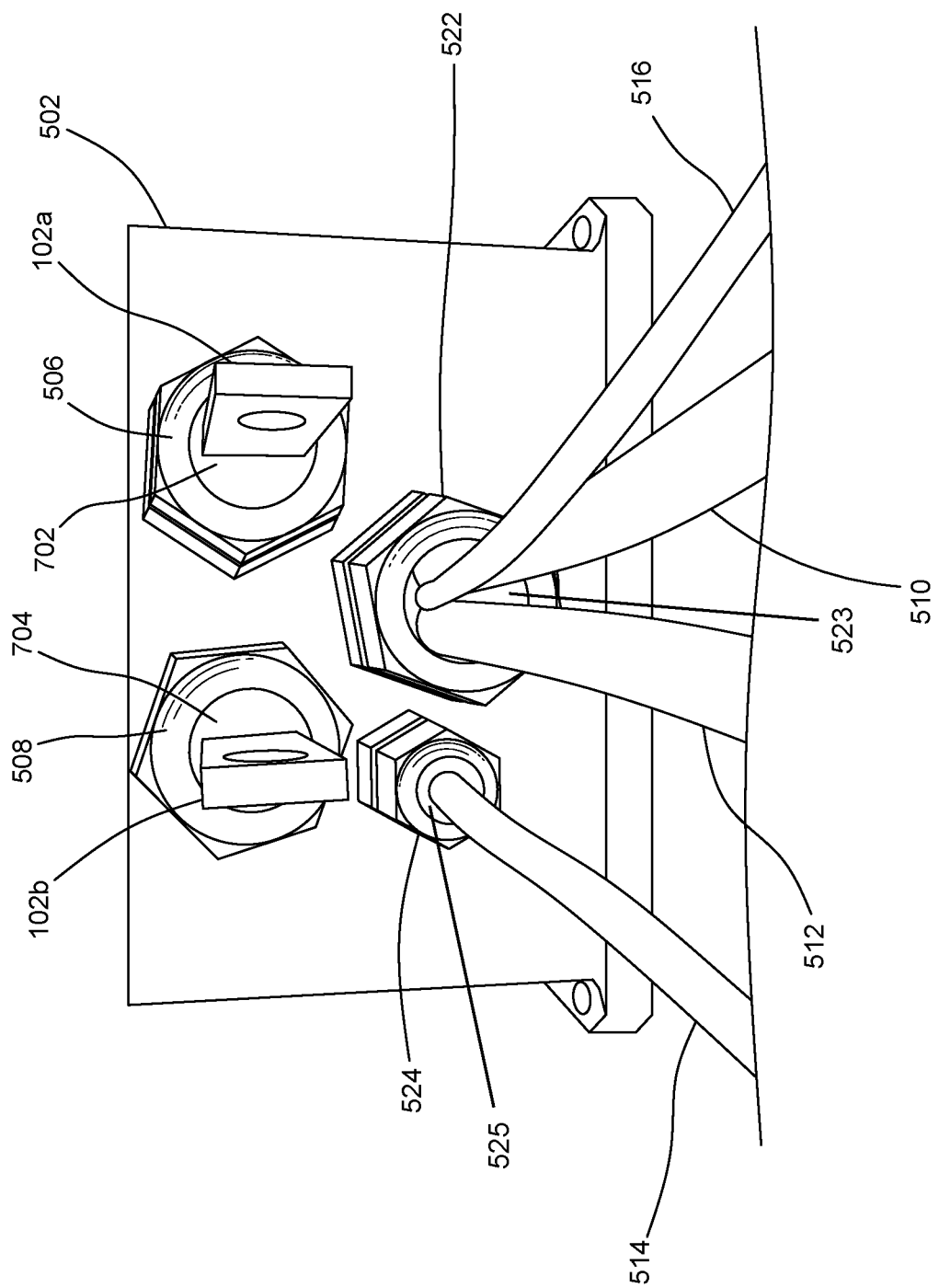
FIG. 7 is a front view of a thruster power control box assembly, in accordance with some embodiments.
Figure 8:
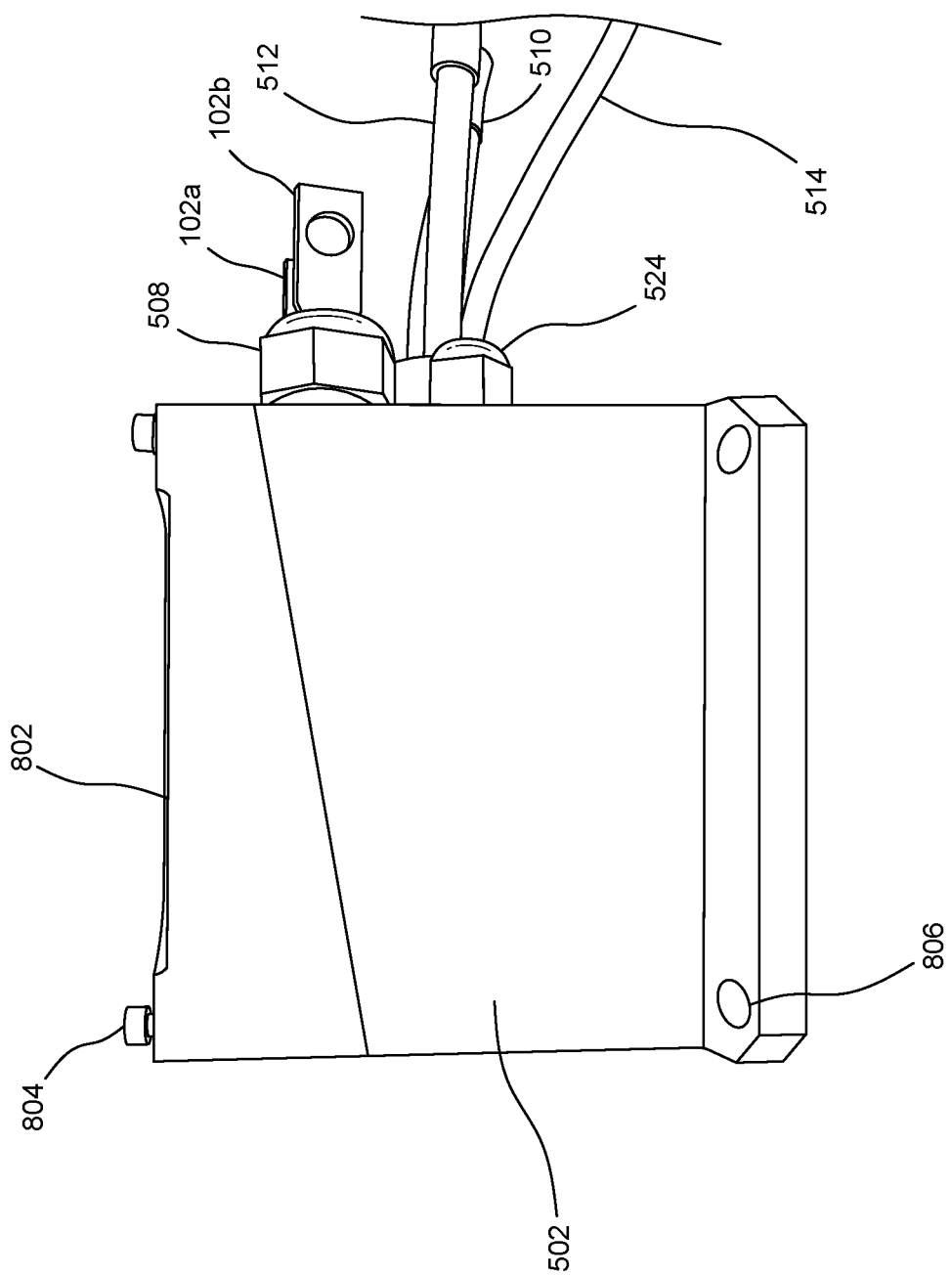
FIG. 8 is a side view of a thruster power control box assembly, in accordance with some embodiments.

FIG. 5 is a top perspective view of an open thruster power control box assembly 500, in accordance with some embodiments. FIGS. 6-8 also provide other views of the box assembly 500. In FIG. 5 the cover 802 of the base 502 of the housing is removed so that the internal components and their arrangement and configurations can be seen as an example of some arrangements consistent with the inventive embodiments. The housing is comprised of the base 502 and the cover 802 (see FIG. 8). The top of the walls of the box can include a gasket groove 504 or bed in which a gasket ring can be placed to seal the top of the base 502 to the lower part of the box cover 802. Conductor bars 100*a*, 100*b* can be seen routed along the sides of the base 502, with the connector ends 102*a*, 102*b* extending out the front side of the base 502 past compression nuts 506, 508, respectively. Conductor bar 100*a* extends through first conductor bushing 530, and conductor bar 100*b* extends through conductor bushing 532. The conductor bushings 530, 532 each pass through the front side of the housing 502 and are a tube structure with threads on the outside of the bushing. The conductor bushings 530, 532 each have an anti-rotation nut 534, 538 coupled to one end of the bushing that is inside of the housing. These are used to prevent the bushing from turning when a sealing nut 536, 540, respectively are tightened against a complaint washer on the bushing, between the sealing nut and the side of the housing. Further, the anti-rotation nuts 534, 538 are used when tightening the compression nuts 506, 508, respectively, to prevent the bushings from turning.

It can be seen that conductor bars 100*a*, 100*b* are mirror images of each other. The terminal sections 118*a*, 118*b* of the conductor bars 100*a*, 100*b* are fastened to the inputs 519, 521 of a switch circuit 518. Thruster cables 510, 512 are coupled to the outputs 526, 528 of the switch circuit 518 and pass through a thruster cable bushing 522. In the present illustration, conductor bar 100*b* can be connected to the battery positive, and conductor bar 100*a* can be connected to the battery negative. The switch circuit 518 directs current from the battery positive to one of the thruster cables, and the current returns through the other thruster cable, through the switch circuit to the battery negative. The direction of current thought the thruster cables is selected by operation of the thruster actuator control, which a user operates to select the direction of thrust. Signals from the actuator are provided through control cable 514, which passes through thruster actuator bushing 524 (as seen in FIGS. 6 & 7), and is connected to the switch control circuit 520. Both direction and magnitude of current are controlled by the switch control circuit 518 to select the direction and speed of the thruster. A thermal sensor line 516 is connected to a temperature sensor in the thruster unit and a signal representing a thruster temperature, or temperature alarm, is provided to the switch control circuit 520. If the thruster unit reaches an excessive temperature, as indicated by the signal carried by the thermal sensor line 516, the switch control circuit 520 can shut off current to the thruster, despite operation of the thruster control actuator.

In FIG. 7 the connector ends 102*a*, 102*b* can be seen extending outward from respective bushings that are capped with compression nuts 506, 508. The connector ends 102*a*, 102*b* are separated by a suitable distance, such as about four centimeters, to prevent any electrical arcing between the connector ends 102*a*, 102*b* as well as to provide sufficient separation to reduce the chance of any incidental shorting by some other object. Disposed in each bushing is a compliant plug 702, 704, respectively through which the conductor bars 100*a*, 110*b* pass. The compliant plugs 702, 704 can be silicone, for example, and the pass-through sections 106 of each of the conductor bars 100*a*, 100*b* pass through a passage in the respective plug 702, 704. The compression nuts 506, 508 compress the end of the respective plugs 702, 704 to ensure a seal around the conductor bars 100a, 100b. Likewise compression nuts on thruster cable bushing 522 and thruster actuator bushing 524 can act on compliant plugs seated in respective bushings through which the various cables pass. Similarly the control cable passes through a compliant plug 525 in a bushing on which compression nut 524 is threaded, and the thruster cables 510, 512 and thruster temperature cable 516 pass through a plug 523 in a bushing 522 on which a compression nut is threaded. The compression nuts 506, 508 on bushings 530, 532, and those on bushings 522, 524 can be fit over their respective bushings to seal the openings through the bushings and to seal around the cables passing through the plugs 523, 525, 702, 704.

In FIG. 8, a side perspective view of the thruster power control box assembly 500, it can be seen that the cover 802 fit on the lower portion 502 of the box assembly 500. Screws 804 pass through the top vertically and into threaded receivers in the corners of the base 502. The bottom of the base 502 includes a flange in which openings 806 are formed to allow mounting of the box assembly to a vessel. As mentioned herein above, a gasket sits between the cover 802 and the main box body 502, in the gasket grove 504. Keeping the box sealed is important to both exclude water, being on a boat, as well as to exclude fumes from inside the box in case of an electrical failure.

Figure 9:
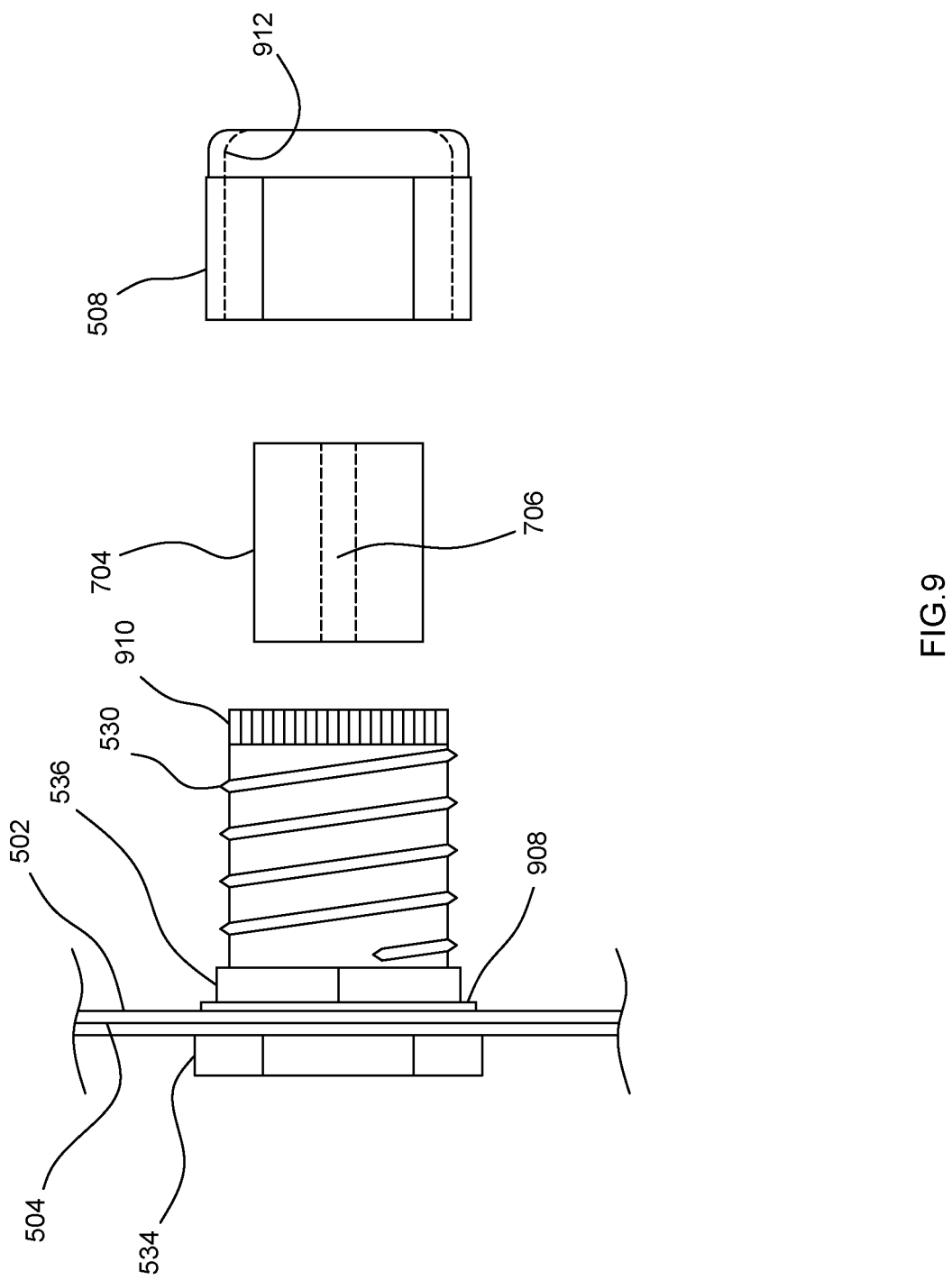
FIG. 9 is a top view of a bushing for supporting and sealing a battery current conductor.

FIG. 9 is a top view of a bushing 530 for supporting and sealing a battery current conductor. in particular, shown is an exploded overhead view of a portion of the front side of the base 502 at which the positive conductor bar 100a passes through the front side of the base 502. The threaded bushing 530 passes through an opening in the front side of the base 502 and can be threaded into the opening at one end of the bushing 902 by, for example, turning a anti-rotation nut 534 on the inner end of the bushing 530. An outer sealing nut 536 can then be applied against a washer 908 that seals the opening through which the bushing 530 passes. The bushing 530 extends outward from the base 502, and a distal end of the bushing 530 is formed into a series of fingers 910 that can deflect at their distal end. The fingers 910 can be formed by providing a series of slots into the end of the bushing 530 around the end of the bushing 530. A compliant plug 702 fits snugly inside the bushing 530 and has a channel 706 that passes through the plug 702. The is, the plug 74 has an outer diameter that is substantially equal to the inner diameter of the bore through the bushing 530. In this example, as the bushing 530 is meant for a conductor bar, the conductor bar would be inserted through the channel 706 so that the battery connecting end 102a extends outward from the plug 704 and the pass-through section 106a sits in the channel 706. The compression nut 508 has a bore through it that is threaded to mate with the threads on outside of the bushing 530. The compression nut 508 has a curved surface 912 on the inside near the outer end of the nut 508, which is open. In general, the conductor bar is inserted through the plug 704, and then the plug 704 can be inserted into the bushing 530. The plug 704, at its inner end, bears against a rim inside the bushing 530 and may extend slightly beyond the distal ends of the fingers 910 when seated in the bushing 530. When the connector nut 508 is then tightened over the bushing 530, the curved surface 912 urges the fingers 910 inward against the plug 704 thereby compressing the plug 704 against the conductor bar passing through channel 706. A similar configuration can be used for the other bushings 522, 524, 532 for the other conductor bar, the thruster cables 510, 512 and thermal sensor cable 516, and the thruster actuator cable 514. Thus, each of the bars or cables passing through bushings 522, 524, 530, 532 are sealed against their respective plug by the respective bushings having distal fingers in combination with the compliant plug being compressed by the respective compression nut bearing on the distal fingers as the compression nut is tightened. As a result, the thruster power control box (e.g. 502 and 802) forms a sealed enclosure that, while it keeps water out, more importantly it provides protection against ignition by also excluding vapor/fumes from the interior of the box. By sealing the box and providing the connections on the outside of the box, there is no need for an installer who is installing a thruster unit on a boat to open the box, which could compromise the integrity of the seal when the box is closed again.

Figure 10:
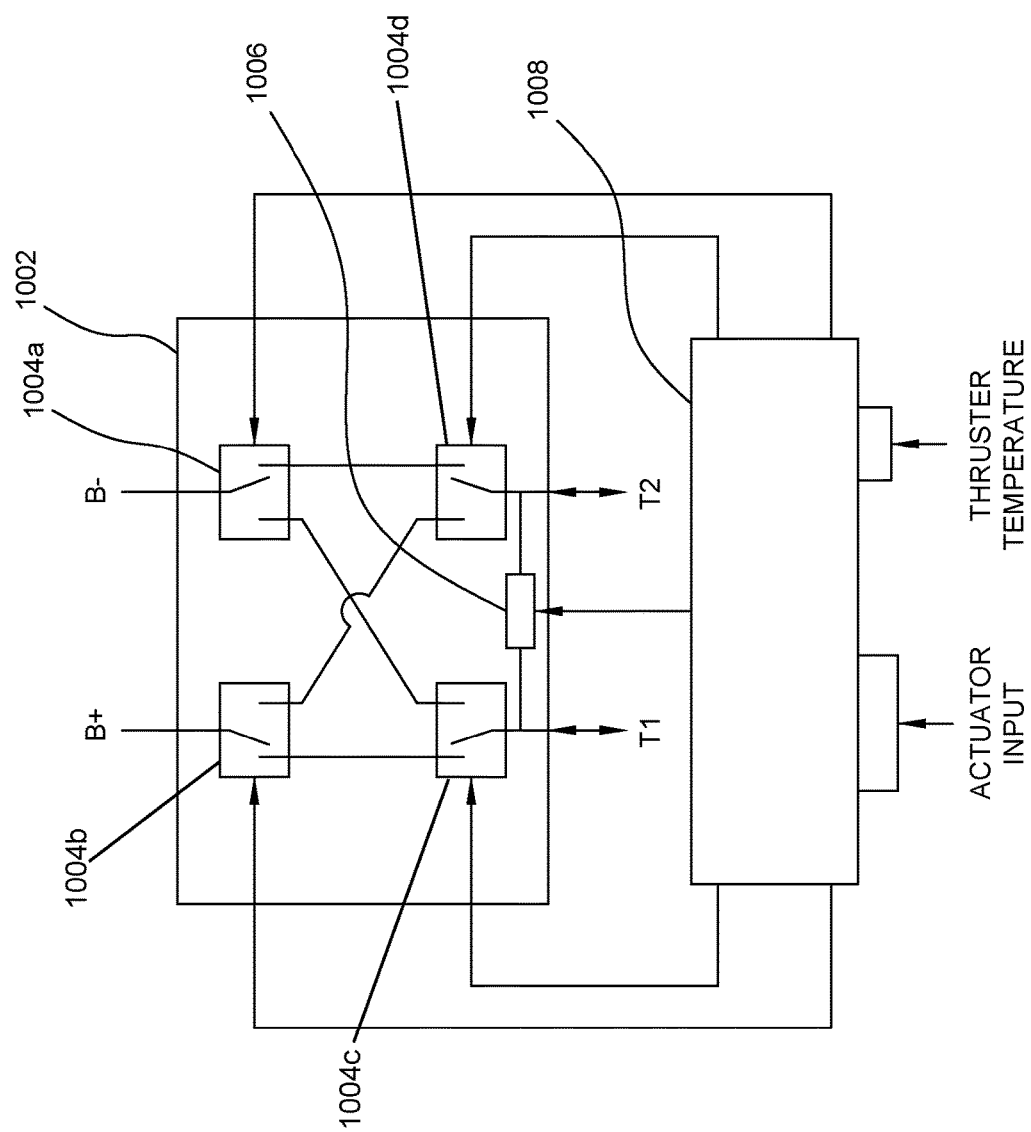
FIG. 10 is a block schematic diagram of a thruster power control circuit, in accordance with some embodiments.

FIG. 10 is a block schematic diagram of a thruster power control circuit, in accordance with some embodiments. A switch circuit 1002 includes a switch tree comprised of four switches 1004a-1004d including two input switches 1004b, 1004a at the top that are connected to the battery positive (B+) and the battery negative (B−) respectively. These input switches direct current through the output switches 1004c, 1004d at the bottom, which are connected to thruster cables T1 and T2. If the B+ is connected to T1, then T2 will be connected to B− to cause the thruster to produce thrust in one direction. To produce thrust in the opposite direction the B+ can be connected to T2, and T1 can be connected to the B−. The switches 1004a-1004d are controlled by a switch control circuit 1008 that is responsive to signals from the actuator control, and convert the signal from actuator control to switch states, and to throttle control 1006. The switches 1004 control the direction of current flow, while the throttle control 1006 controls the magnitude of the current going to the thruster. Thus, the switch circuit 1002 has a first input (e.g. B+) and a second input (B−), and a first output (T1) and a second output (T2). The switch circuit 1002 is operable to selectively connect, in a first switch state, the first input to the first output and the second input to the second output, and in a second switch state connect the first input to the second output and the second input to the first output. The switch control circuit 1008, responsive to the actuator input, determines which switch state to configure the switches.

The switch control circuit 1008 can also be responsive to a thermal sensor input (thruster temperature) that restricts current to the thruster if the thruster reaches a preselected temperature in order to protect the thruster from thermal damage. In practice, the actuator can be a simple joystick device that can be moved left or right, corresponding to the desired direction of movement of the vessel, and the amount of movement can be proportional to the desired speed of the thruster. That is, the further the joystick is moved from its neutral position the faster the operator wants the thruster motor to turn, so the switch control circuit 1008 will respond by controlling the throttle control 1006 to regulate current through the thruster cables T1, T2 by varying the resistance of switches 1004c, 1004d. Thus, pushing the joystick to the left or right cause the switch control circuit 1008 to configure the switches 1004 accordingly. The amount of deviation from the center position indicates the amount of thrust (throttle) that is desired. Those skilled in the art will recognize that thruster control is well known in the art, and there are numerous implementations of thruster control circuity and switching arrangements that can be used equivalently. Any prior art thruster control circuitry can be used in the thruster power control box assembly.

Figure 11:
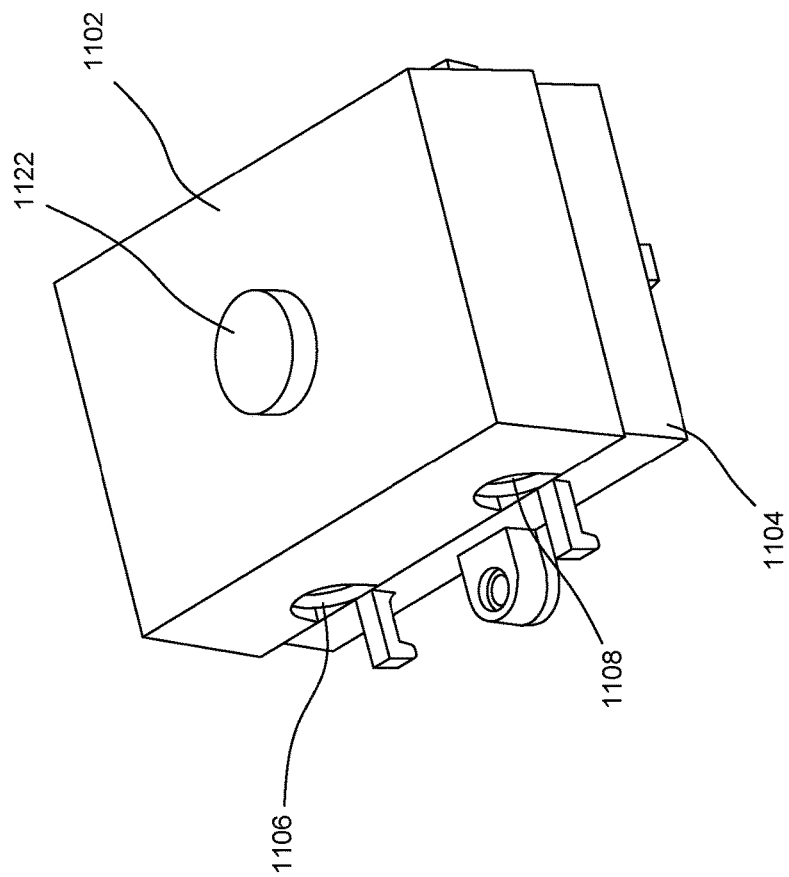
FIG. 11 shows a top perspective view of a terminal box that can be used with the thruster power control box assembly to interconnect the thruster cables of the thruster power control box assembly with the cable of the thruster.

FIG. 11 shows a top perspective view of a terminal box 1100 that can be used with the thruster power control box assembly to interconnect the thruster cables of the thruster power control box assembly with the cable of the thruster. Thruster cables 510, 512 provide electric current to the thruster motor, but are terminated with connecting features that allow them to be connected to corresponding cables of the thruster. That is, thruster cables 510, 512 are part of the thruster power control box assembly, and thus extend from the base 502 a short distance so as to be able to be electrically connected with the corresponding cable leads of the thruster. The terminal box 1100 is designed to connect the thruster cables 510, 512 of the thruster power control box to the thruster cables that are connected to the thruster unit.

Figure 12:
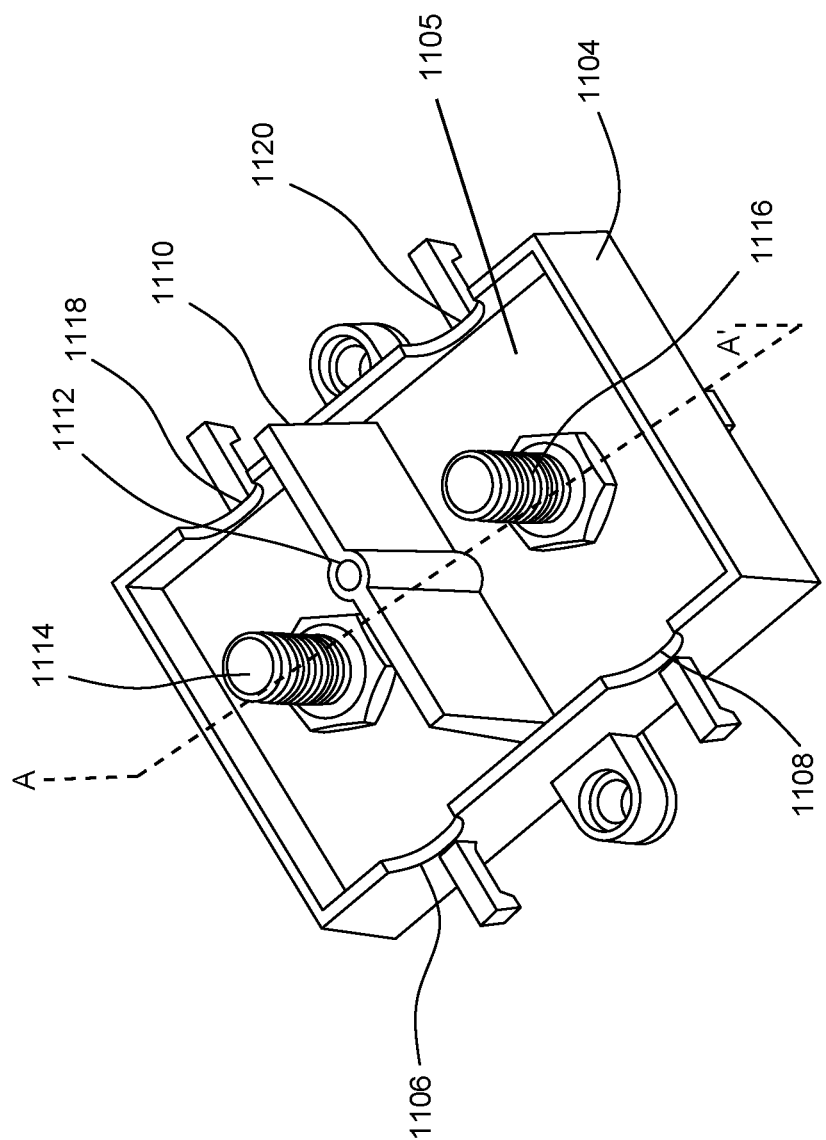
FIG. 12 shows a perspective view of the terminal box with the cover removed.
Figure 13:
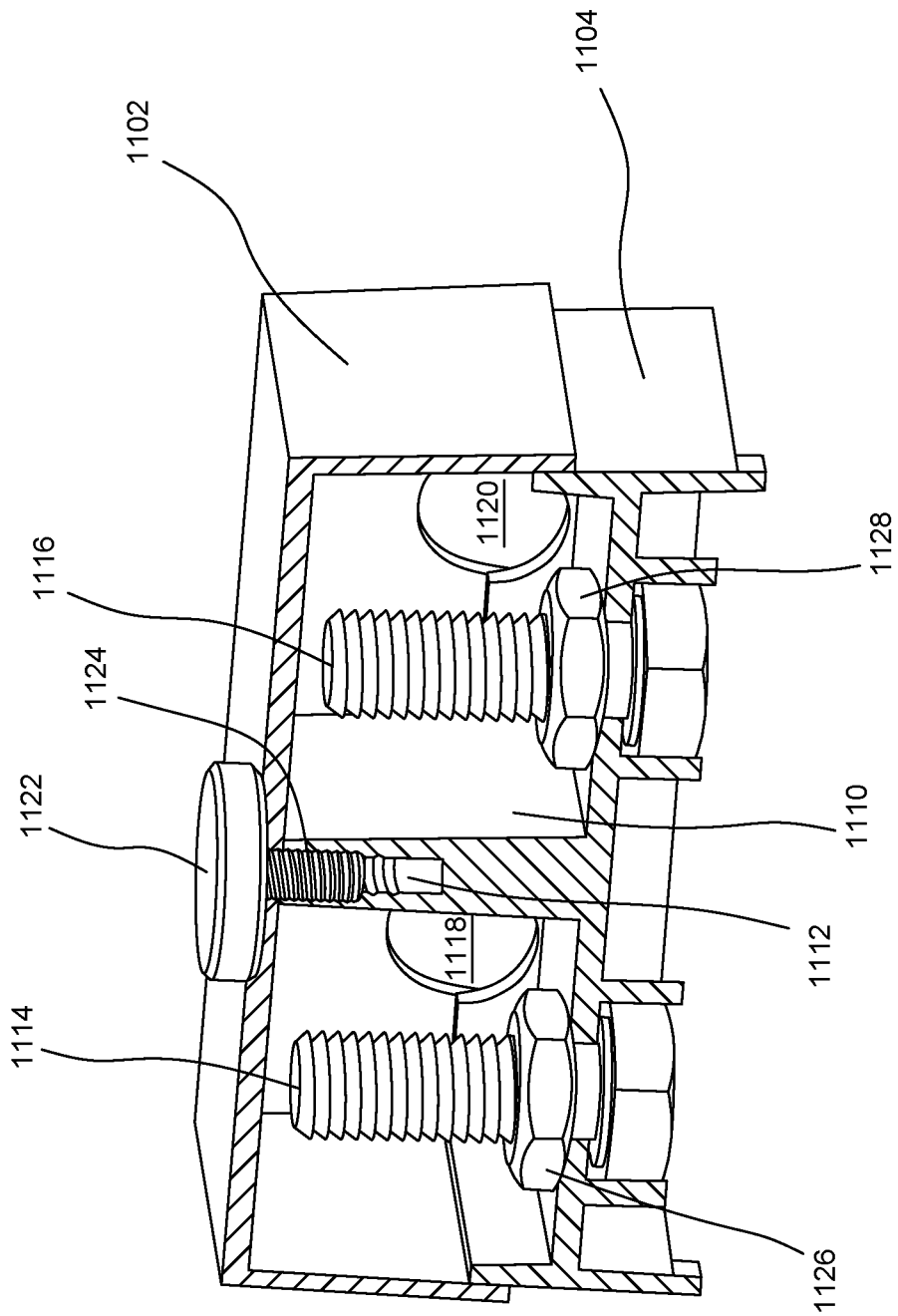
FIG. 13 shows a cutaway view of the terminal box.
Figure 14:
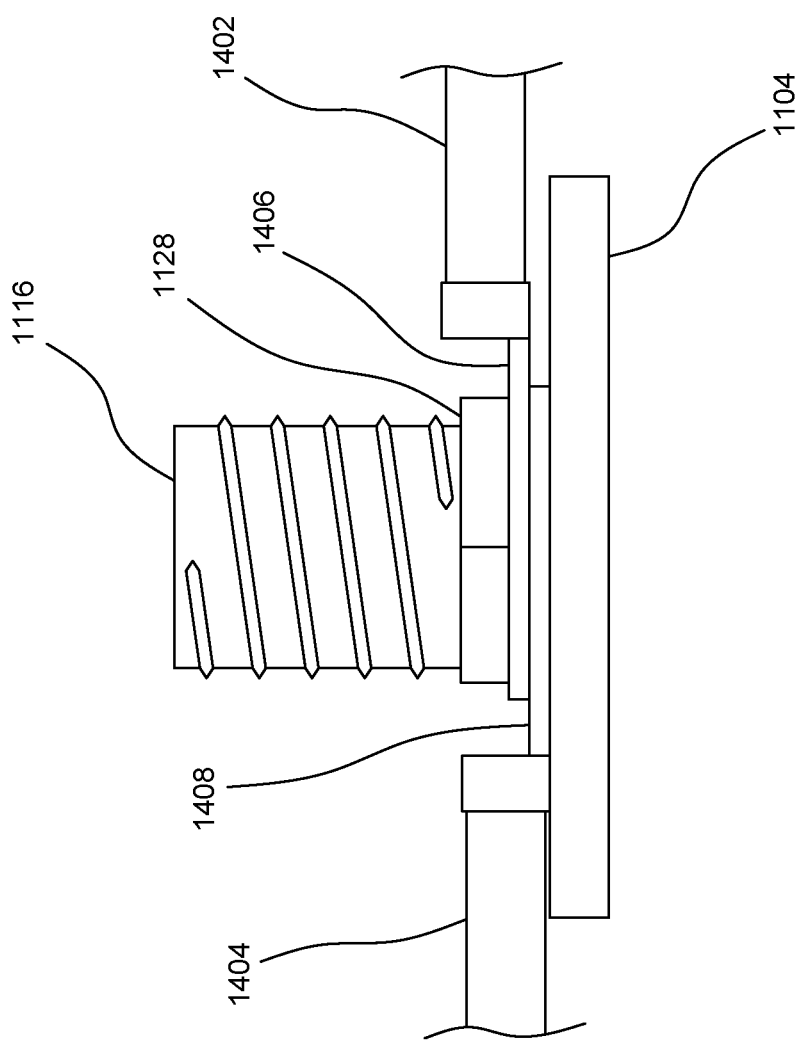
FIG. 14 shows the connection of thruster cables inside of the terminal box.

The terminal box 1100 includes a cover 1102 and a base 1104, and at the front include cable openings 1106, 1108 through which a cable can pass. Similar openings to 1106, 1108 are provided on the opposite side of the terminal box 1100, which is hidden from view in FIG. 11. A knob 1122 is connected to a threaded shaft which fastens the cover 1102 to the base 1104. In FIG. 12, the cover 1102 is removed showing the base 1104 and what is inside the terminal box 1100. Openings 1118, 1120 at the rear of the terminal box are formed by semicircular cutouts in the rear wall of the base 1104. Likewise, similar semicircular cutouts are formed at the bottom of the rear wall of the cover to form a complete circular opening. Likewise with openings 1106, 1108 at the front of the terminal box. A central wall 1110 runs across the middle of the base, from front to rear, extending upwards from the floor 1105 of the base 1104, and the wall 1110 is high enough to meet the top of the cover 1102 when the cover 1102 is in place on the base 1104. The central wall 1110 thus divides the interior of the terminal box into two sections, each with a front cable opening 1106, 1108 and a rear cable opening 1118, 1120. In the approximate middle of each half, on each side of the central wall 1110 there are threaded studs 1114, 1116, which can be the shaft of a bolt that passes through the floor of the base. In FIG. 13 there is shown a cutaway view taken along a central section A-A' passing from side to side of the terminal box, parallel to the front a rear walls. As can be seen, a threaded shaft 1124 is coupled to the knob 1122 and fit within the threaded bore 1112 of the central wall 1110 to fasten the cover 1102 onto the base 1104. The threaded studs 1114, 1116 can be seen as the shafts of bolts passing through the floor of the base. Each stud 1114, 1116 can have one or more nuts 1126, 1128 and washers (not shown). In connecting the thruster cables 510, 512, the end each of the cables 510, 512 can pass through one of the rear openings 1118, 1120, respectively. The ends of the cables have flat connectors with a hole that is slightly larger than the diameter of the studs 1114, 1116 to fit over the corresponding stud. Likewise, cables from the thruster can pass through the front openings and be connected to the studs 1114, 1116, thereby making an electric connection between the thruster cables of the thruster power control box assembly and the cables directly connected to the thruster. This is shown in FIG. 14, where a first cable 1402, which can be one of cables 510, 512, is terminated with an annular terminal 1406, which has an opening through which the stud 1116 fits. Likewise, cable 1404 has a similar annular terminal 1408 that is also placed over the stud 1116. A nut 1128 is than tightened against both of the terminals 1406, 1408 to make an electrical connection between the two cables 1402, 1404. Once the cables on both sides of the terminal box are installed similar to that shown here, the cover 1102 can be installed on the base 1104. The terminal box can have features that allow for mounting of the terminal box in a vessel. Further, the terminal box can be configured to be sealed, such as by providing compliant gasket components between the cover and the base, as well as at the cable openings, in order to prevent the ingress of both water and vapors.

Figure 15:
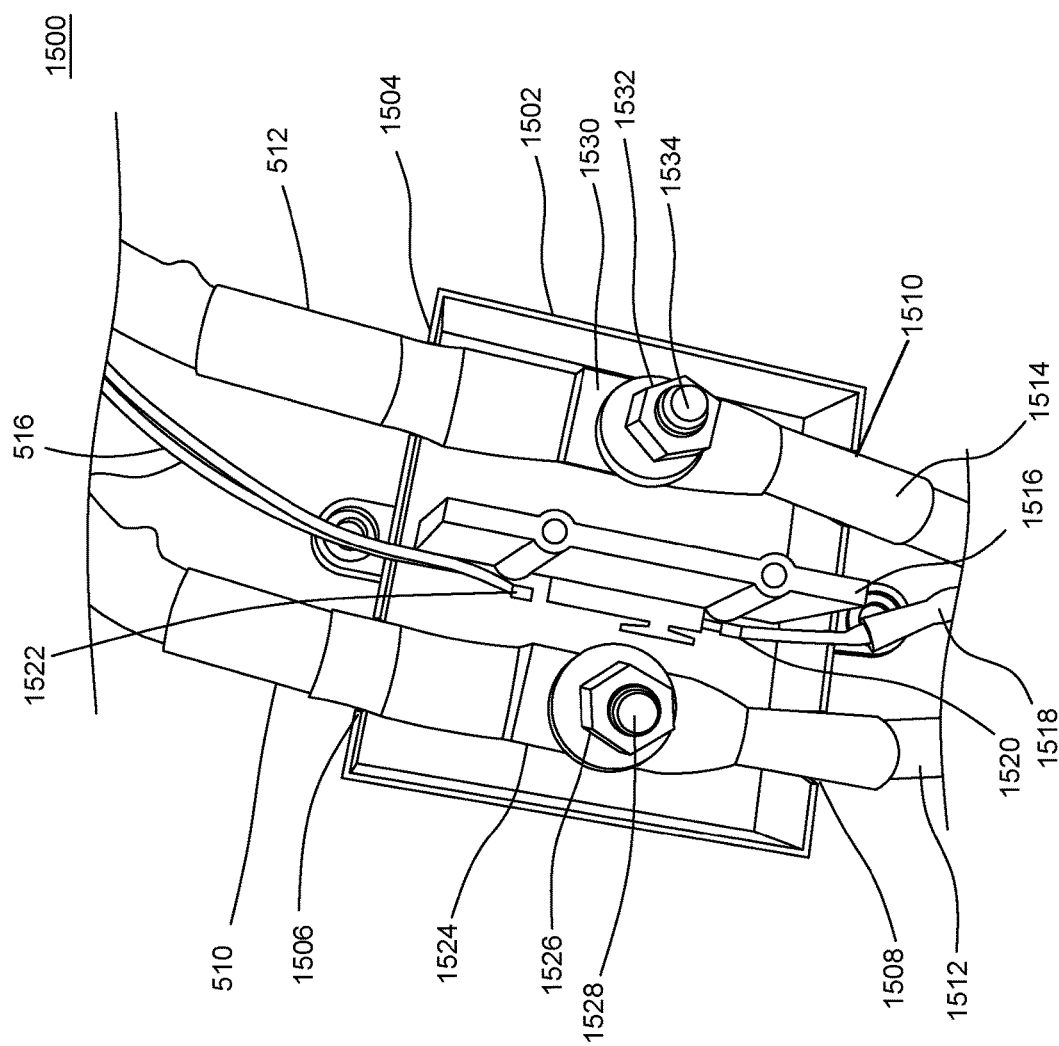
FIG. 15 shows a top perspective view of an open terminal box, in accordance with some embodiments.
Figure 16:
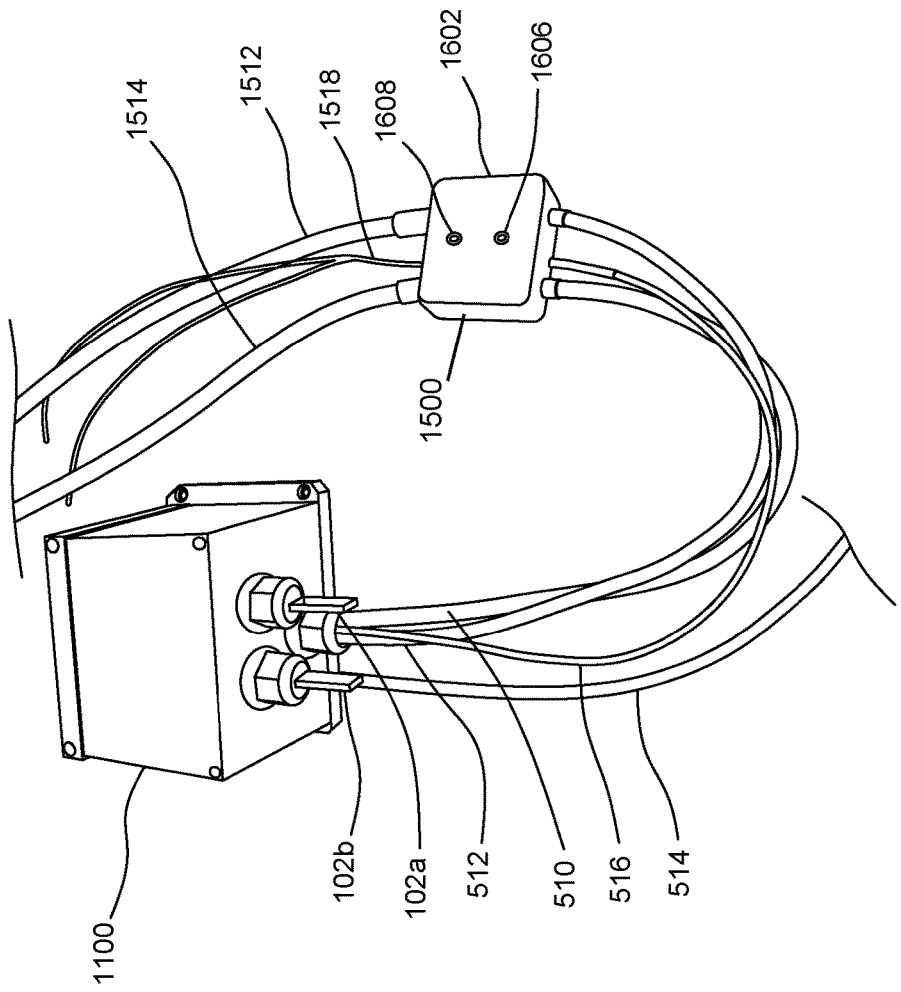
FIG. 16 shows a perspective view of the thruster power control box assembly and the terminal box in an installed system.

FIG. 15 shows a top perspective view of an open terminal box 1500, and FIG. 16 shows a perspective view of the thruster power control box 1100 and the terminal box 1500 in an installed system. Box 1500 is similar to terminal box 1100, but further provides for connections of one or more thermal sensor cables. A bottom 1502 of the box 1500 is shown with the top portion removed. The top portion 1602 is shown in FIG. 16. Thruster cables 510, 512 from the thruster power control box 1100, along with thermal sensing cable 516, are connected to terminals inside the terminal box 1500. Cable 510 passes through opening 1506 in a first side of the box 1500 and is coupled onto terminal 1528 using connector 1524, which terminates the thruster cable 510 and has a flat end with an opening through it so that the terminal 1528 can pass through the opening in the connector 1524. Likewise, a thruster cable 1512 is connected to the thruster, and passes through the box at opening 1508. Thruster cable 1512 likewise has a connector that fits onto terminal 1528, in contact with connector 1524. The connectors are metal, and therefore conductive. A nut 1526 presses a washer against the two connectors on terminal 1528 to provide a robust electrical contact between the connectors. Likewise, thruster cable 512 from the thruster power control box passes through opening 1504 in the terminal box 1500, and has a connector 1530 that fits over terminal 1534. Cable 1514 from the thruster passes through opening 1510 and also has a connector that fits onto terminal 1534 to be pressed into contact with connector 1530 by nut 1532. Thus, cable 510 is electrically connected to cable 1512 at terminal 1528, and cable 512 is electrically connected to cable 1514 at terminal 1534. A central wall 1516 separates the two sides of the terminal box and runs between the terminals 1528, 1534. The wall extends upwards from the floor of the base inside the terminal box 1500 to meet the inside of the top 1602 of the terminal box 1500. In addition, the thermal sensing cable 516 passes through an opening in the box 1500 and connects to a first terminal 1522 of connector block, which is connected to a second terminal 1520 to which a thermal sensing cable 1518 from the thruster unit is connected. Thus, the thermal signal from the thruster is conducted through the terminal box 1500 to the thruster power control box. The top portion 1602 can be secured to the bottom or base 1502 by, for example, fasteners 1606, 1608 that pass through the top surface of the top portion 1602 and into threaded bores in the central wall 1516.

A marine thruster power control box assembly has been disclosed that eliminates the need for installers to open the box to make connections to the circuitry therein, reducing opportunities for damaging the thruster power control circuitry, and greatly simplifying the connection process. The disclosed thruster power control box assembly does this my mounting conductor bars for the batter positive and negative connections that pass through the box wall to connect to the switching circuitry inside the box. The conductor bars extend outside of the box, and are rigid so as to maintain separation between them. Inside the box the conductor bars area routed around the sides of the box on opposite sides in order to maximize access to the circuitry inside the box if a need arises to service the circuitry inside the box.

What is claimed is:

1. A marine thruster power control box assembly, comprising:
   a housing having a lower housing portion and an upper housing portion;
   a power switch circuit and a switch control circuit disposed in the lower portion of the housing;

a first conductor bar extending through a front side of the lower portion of the housing and having a connector extension section outside of the lower housing portion, and a contiguous section inside the lower housing portion that is coupled to a first input of a switch circuit inside the housing;

a second conductor bar extending through the front side of the lower portion of the housing and having a connector extension section outside of the lower housing portion, and a contiguous section inside the lower housing portion that is coupled to a second input of the switch circuit;

a first thruster cable coupled to a first output of the switch circuit and a second thruster cable coupled to a second output of the switch circuit, wherein the first and second thruster cables pass through the side of the lower housing and extend outside of the lower housing; and a thruster actuator control cable that passes through a side of the lower housing portion and connects to a switch circuit controller that controls operation of the switch circuit.

2. The marine thruster power control box assembly of claim 1, wherein the first conductor bar passes through a first bushing, the second conductor bar passes through a second bushing, wherein each of the bushings include a compliant plug configured to seal the respective bushing, wherein the first and second conductor bars each pass through a channel in the respective plugs.

3. The marine thruster power control box assembly of claim 2, wherein the first and second bushing each have distal fingers on a distal end of the respective bushing, and wherein each of the first and second bushings each include a compression nut that bears against the distal fingers to impart a compressive force to the plug in the bushing.

4. The marine thruster power control box assembly of claim 1, wherein the thruster actuator control cable passes through a compliant plug disposed in a thruster cable bushing that passes through the side of the housing.

5. The marine thruster power control box assembly of claim 1, further comprising a thruster cable bushing through the side of the housing, wherein the thruster cables both pass through a compliant plug disposed in the thruster cable bushing.

6. The marine thruster power control box assembly of claim 5, further comprising a thermal sensing cable that passes through the plug in the thruster cable bushing.

7. A thruster power control box, comprising:
a housing having a base and a cover
a switch circuit having a first input and a second input, and further having a first output and a second output, wherein the switch circuit is operable to selectively connect, in a first switch state, the first input to the first output and the second input to the second output, and in a second switch state connect the first input to the second output and the second input to the first output;
a switch control circuit that is responsive to an actuator input to control the switch circuit between the first and second switch states;
a first battery conductor connected to the first input of the switch circuit at a terminal section of the first battery conductor, the first battery conductor having a battery end that extends through a first conductor bushing in a side of the housing, the first conductor bushing having a seal around the first battery conductor;
a second battery conductor connected to the second input of the switch circuit at a terminal section of the second battery conductor, the second battery conductor having a battery end that extends through a second conductor bushing in the side of the housing, the second conductor bushing having a seal around the second battery conductor;
a first thruster cable coupled to the first output of the switch circuit, a second thruster cable coupled to the second output of the switch circuit, wherein the first and second thruster cables pass through a thruster cable bushing through the side of the housing, the thruster cable bushing having a seal around the first and second thruster cables; and
a thruster actuator cable that is coupled to the switch control circuit and which passes through a thruster actuator bushing through the side of the housing, the thruster actuator bushing having a seal around the thruster actuator cable.

8. The thruster power control box of claim 7, wherein:
the seal in the first conductor bushing comprises a compliant plug through which the first battery conductor passes, and which surrounds the first battery conductor, and wherein a compression nut disposed on the first conductor bushing compresses the compliant plug against the first battery conductor; and
the seal in the second conductor bushing comprises a compliant plug through which the second battery conductor passes, and which surrounds the second battery conductor, and wherein a compression nut disposed on the second conductor bushing compresses the compliant plug in the second bushing against the second battery conductor.

9. The thruster power control box of claim 8, wherein the seal in the thruster cable bushing comprises a compliant plug through which the first thruster cable and the second thruster cable both pass, and which surrounds both the first and second thruster cables, and wherein a compression nut disposed on the thruster cable bushing compresses the compliant plug in the thruster cable bushing against the first and second thruster cables.

10. The thruster power control box of claim 8, where the seal in the thruster actuator bushing comprises a compliant plug through which the thruster actuator cable passes, and which surrounds the thruster actuator cable, and wherein a compression nut disposed on the thruster actuator bushing compresses the compliant plug in the thruster actuator bushing against the thruster actuator cable.

11. A thruster power control box system, comprising:
a thruster power control box comprising a housing and having:
a switch circuit disposed in the housing having a first input, a second input, a first output, and a second output;
a switch control circuit operably coupled to the switch circuit that selectively controls configuration of connections between the first input one of either of the first or second outputs, and between the second input and the other of the first or second outputs of the switch circuit;
a first battery conductor having a battery connecting portion that extends outside of the housing through a first conductor bushing that contains a compliant plug through which the first battery conductor passes and which seals the first conductor bushing, wherein the first battery conductor is connected to the first input of the switch circuit;
a second battery conductor having a battery connecting portion that extends outside of the housing through a second conductor bushing that contains a compliant plug through which the second battery conductor passes and which seals the second conductor bushing, wherein the second battery conductor is connected to the second input of the switch circuit;
a thruster cable bushing having a compliant plug through which a first thruster cable and a second thruster cable pass, the first thruster cable connected to the first output of the switch circuit, the second thruster cable connected to the second output of the switch circuit;
a thruster actuator bushing having a compliant plug through which a thruster actuator cable passes, the thruster actuator cable connected to the switch control circuit;
a terminal box having:
a housing and a cover, a central wall inside the terminal box that runs from a front to a back of the terminal box, and from a floor of the housing to the cover; and
a first terminal disposed on a first side of the central wall and a second terminal disposed on a second side of the central wall, the first thruster cable coupled to the first terminal, the second thruster cable coupled to the second terminal.

12. The thruster power control box system of claim 11, wherein each of the first conduct bushing, second conductor bushing, thruster cable bushing, and thruster actuator bushing each comprise a compression nut that compressed the compliant plug in each of the first conduct bushing, second conductor bushing, thruster cable bushing, and thruster actuator bushing.

* * * * *